(12) United States Patent
Lin et al.

(10) Patent No.: US 11,931,776 B2
(45) Date of Patent: Mar. 19, 2024

(54) ACTUATOR, METHOD FOR MANUFACTURING THE ACTUATOR, AND ACOUSTIC TRANSMITTER

(71) Applicant: INDUSTRIAL TECHNOLOGY RESEARCH INSTITUTE, Hsinchu (TW)

(72) Inventors: Chia-Hsin Lin, Hsinchu (TW); Ching-Iuan Sheu, Hsinchu (TW); Yu-Tsung Chiu, Hsinchu (TW); Chun-Ti Chen, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1484 days.

(21) Appl. No.: 16/232,176

(22) Filed: Dec. 26, 2018

(65) Prior Publication Data
US 2020/0206779 A1 Jul. 2, 2020

(51) Int. Cl.
*B06B 1/06* (2006.01)
*H02N 2/04* (2006.01)
*H10N 30/50* (2023.01)

(52) U.S. Cl.
CPC .......... *B06B 1/0611* (2013.01); *H02N 2/043* (2013.01); *H10N 30/50* (2023.02)

(58) Field of Classification Search
CPC ....... B06B 1/0611; H02N 2/043; H10N 30/50
See application file for complete search history.

(56) References Cited

U.S. PATENT DOCUMENTS 5,515,343 A    5/1996  Boucher et al.
5,729,077 A *  3/1998  Newnham ............. H02N 2/043
                                                310/369
(Continued)

FOREIGN PATENT DOCUMENTS

CN    1265000    8/2000
CN    1339237    3/2002
(Continued)

OTHER PUBLICATIONS

Chinese Office Action for Chinese Patent Application No. 201811598547.0 dated Apr. 2, 2021.
(Continued)

*Primary Examiner* — Bryan P Gordon
(74) *Attorney, Agent, or Firm* — Amin, Turocy & Watson, LLP

(57) ABSTRACT

Provided are an actuator, method for manufacturing the actuator, and acoustic transmitter having the actuator. The actuator includes: an elastic metal member having a plurality of curved segments and a plurality of connection segments which constitute a ring structure with a long-axis direction and a short-axis direction; a multilayer piezoelectric member disposed within the ring structure and having a plurality of stacked piezoelectric units along the long-axis direction; and a plurality of coupling members disposed within the ring structure, wherein the multilayer piezoelectric member has two ends in the long-axis direction that are coupled to the connection segments of the elastic metal member in the long-axis direction. A preload stress is imparted to the elastic metal member. A plurality of coupling members having a size corresponding to the preload stress are disposed between the elastic metal member and the multilayer piezoelectric member.

17 Claims, 8 Drawing Sheets

(56) References Cited

U.S. PATENT DOCUMENTS

| | | | | |
|---|---|---|---|---|
| 7,650,066 B2* | 1/2010 | Sasaki | ............... | H02N 2/025 |
| | | | | 310/323.15 |
| 8,593,035 B2* | 11/2013 | Asada | ............... | H02N 2/105 |
| | | | | 310/328 |
| 2013/0069481 A1 | 3/2013 | Kimura et al. | | |
| 2016/0299050 A1 | 10/2016 | Dorovsky et al. | | |
| 2019/0196597 A1* | 6/2019 | Rinner | ............... | H02N 2/043 |
| 2019/0334077 A1* | 10/2019 | Galler | ............... | H10N 30/886 |
| 2020/0206779 A1* | 7/2020 | Lin | ............... | G01M 3/243 |

FOREIGN PATENT DOCUMENTS

| | | |
|---|---|---|
| CN | 1767225 | 5/2006 |
| CN | 201029221 | 2/2008 |
| CN | 101262959 | 9/2008 |
| CN | 102460938 | 5/2012 |
| CN | 102668148 | 9/2012 |
| CN | 102682756 | 9/2012 |
| EP | 1769759 A2 | 4/2007 |
| EP | 01769759 | 8/2008 |
| GB | 2163925 | 3/1986 |
| TW | 201239393 | 10/2012 |
| TW | 201803161 | 1/2018 |

OTHER PUBLICATIONS

Taiwanese Office Action for Taiwanese Patent Application No. 107147135 dated May 30, 2019.

* cited by examiner

ACTUATOR, METHOD FOR MANUFACTURING THE ACTUATOR, AND ACOUSTIC TRANSMITTER

BACKGROUND

1. Technical Field

This disclosure relates to actuators, methods for manufacturing the same and acoustic transmitters, and, more particularly, to an actuator employing a piezoelectric technique, a method for manufacturing the actuator, and a low-frequency acoustic transmitter having the actuator.

2. Description of Related Art

Water pipes or other pipelines leak for many reasons. For instance, a pipeline under a great external force is likely to be cracked or broken due to its great internal pressure or uneven loading. In addition, a joint and a plastic washer between two jointed pipelines may degrade as time passing by, and with the factors of corrosion and vibration shift, fluid or gas in the pipelines may leak from the loosened joint. The pipeline is also likely to be eroded by water or soil where it is disposed, and has a decreased strength. A valve may not be fastened to the pipeline securely, and fluid or gas may also leak.

In the prior art, a plurality of emitters that can emit signals of specific frequencies are disposed on the pipeline, and an operator uses a receiver to receive the reflective frequencies. An acoustic wave can also be introduced through the valve, to allow a receiver on the ground to know the position of the pipeline through the movement of the acoustic wave in the pipeline.

In general, a pipeline to be detected is hundreds of meters, or even several kilometers long. Hence, the signals emitted by the transmitter have to travel long enough in order to reach a position where a hole of the pipeline appears. Such the receiver must have a delicately designed actuator that emits an acoustic wave. Therefore, how to develop an acoustic source that can transmit an acoustic wave to a distant place to detect the leakage of a pipeline actively is becoming an urgent issue in the art.

SUMMARY

In an embodiment according to this disclosure, an actuator comprises: an elastic metal member having a plurality of curved segments and a plurality of connection segments which constitute a ring structure with a long-axis direction and a short-axis direction; a multilayer piezoelectric member disposed within the ring structure of the elastic metal member and having a plurality of stacked piezoelectric units along the long-axis direction; and a plurality of coupling members disposed within the ring structure of the elastic metal member, wherein the multilayer piezoelectric member has two ends in the long-axis direction that are coupled to the connection segments of the elastic metal member in the long-axis direction.

In another embodiment according to this disclosure, a method for manufacturing an actuator comprises: providing a multilayer piezoelectric member having a plurality of stacked piezoelectric units; forming integrally an elastic metal member having a plurality of curved segments and a plurality of connection segments which constitute a ring structure with a long-axis direction and a short-axis direction; imparting a preload stress to the elastic metal member; and coupling, using a plurality of coupling members having a size corresponding to the preload stress, two ends of the multilayer piezoelectric member in its stack direction to the connection segments of the elastic metal member in the long-axis direction.

In yet another embodiment according to this disclosure, an acoustic transmitter comprises: the above-mentioned actuator configured for receiving a voltage and vibrating; a diaphragm disposed on the actuator and attached to one of the connection segments of the elastic metal member in the short-axis direction, so as to be driven by the elastic metal member to vibrate; and a carrier disposed on the actuator and attached to another one of the connection segments of the elastic metal member in the short-axis direction to support the actuator and the diaphragm.

DETAILED DESCRIPTION

Figure 1A:
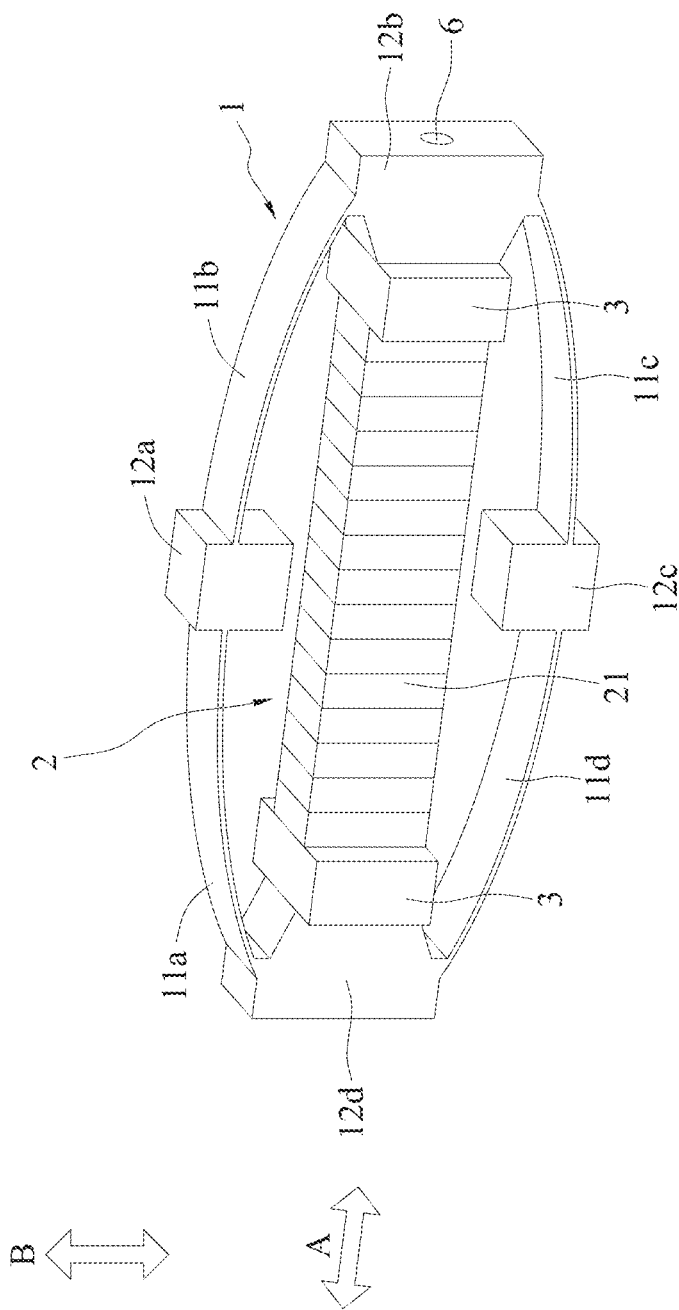
FIG. 1A is a schematic diagram of an actuator of an embodiment according to this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Refer to FIG. 1A. An actuator according to this disclosure comprises an elastic metal member 1, a multilayer piezoelectric member 2 and coupling members 3.

The elastic metal member 1 may have a plurality of curved segments 11a-11d and a plurality of connection segments 12a-12d to constitute a ring structure having a long-axis direction A and a short-axis direction B. The connected curved segments 11a-11d and the connection segments 12a-12d are integrally formed into the ring structure, which is considered as a series connection structure in mechanics. That the curved segments 11 a-11d and the connection segments 12a-12d are integrally formed into the ring structure is only an exemplary embodiment, and this disclosure is not limited thereto. As shown in FIG. 1A, the connection segments 12b and 12d are disposed in the long-axis direction A, the connection segments 12a and 12c are disposed in the short-axis direction B, the curved segments 11a are disposed between the connection segments 12d and 12a and are mirrored symmetrically to the curved segments 11d disposed between the connection segments 12d and 12c with respect to the long-axis direction A, and the curved segments 11b are disposed between the connection segments 12b and 12a and are mirrored symmetrically to the curved segments 11c disposed between the connection segments 12b and 12c with respect to the long-axis direction A.

In addition, each of the curved segments 11a-11d constitutes a portion of an oval. Each of the connection segments 12a-12d may be a line segment. According to this disclosure, the connection segments 12a and 12c can be omitted, leaving the connection segments 12b and 12d only. In such a scenario, the curved segments 11a and 11b constitute a continuous portion of an oval, the curved segments 11c and 11d also constitute a continuous portion of the same oval, so that the continuous portion of the oval constituted by the curved segments 11a and 11b and the continuous portion of the oval constituted by the curved segments 11c and 11d are mirrored symmetrically with respect to the long-axis direction A.

In an embodiment, the elastic metal member 1 having the ring structure can be viewed as a quasi-oval, and comprise two connection segments 12b and 12d in the long-axis direction A and two curved segments (continuous curved segments 11a and 11b and continuous curved segments 11c and 11d) disposed symmetrically with respect to the long-axis direction A. In another embodiment, the elastic metal member 1 comprises two connection segments 12b and 12d in the long-axis direction A, two connection segments 12a and 12c in the short-axis direction B, and four curved segments 11a-11d disposed symmetrically with respect to the long-axis direction A (wherein the curved segments 11a and 11d are disposed symmetrically, and the curved segments 11b and 11c are disposed symmetrically). In yet another embodiment, the elastic metal member 1 comprises more curved segments and connection segments based on the vibration frequency or stroke required by the actuator.

The elastic metal member 1 having the ring structure can be imparted with a preload stress. In an embodiment, the elastic metal member 1 is to have a preload stress by providing an external pulling force or an internal pressure in the long-axis direction, which will be described in detail in the following paragraphs. In an embodiment, the elastic metal member 1 is made of elastic steel, elastic steel alloy, or other elastic metal or alloy.

Figure 1B:
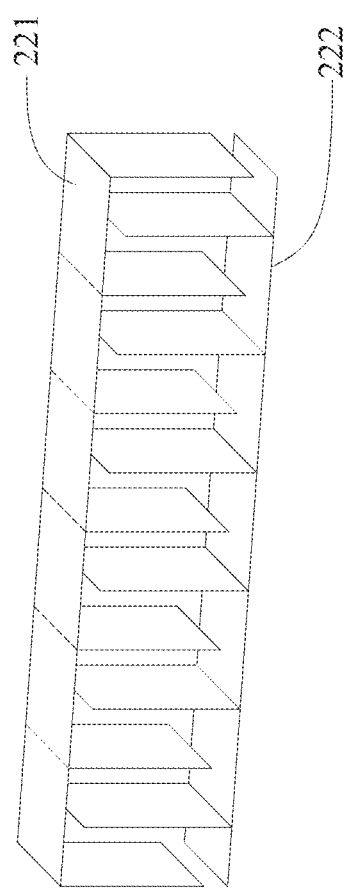
FIG. 1B is a schematic diagram of electrodes of the actuator of an embodiment according to this disclosure.

The multilayer piezoelectric member 2 may comprise a plurality of stacked piezoelectric units 21 and electrodes 221 and 222 disposed on the stacked piezoelectric units 21. In an embodiment, the stacked piezoelectric units 21 may be piezoelectric pieces, as shown in FIG. 1B. The stacked piezoelectric units 21 are disposed within the ring structure of the elastic metal member 1 in a stacking direction, in which the stacked piezoelectric units 21 are stacked and which is parallel to the long-axis direction A of the elastic metal member 1. The electrodes 221 and 222 are disposed as shown in FIG. 1B, in contrast to FIG. 1A, which shows that the electrodes 221 are disposed above and between the stacked piezoelectric units 21, and the electrodes 222 are disposed below and between the stacked piezoelectric units 21. Therefore, each of the stacked piezoelectric units 21 has the electrodes 221 and 222 on its left and right sides, respectively (the long-axis direction A), and each of the stacked piezoelectric units 21 has the electrodes 221 and 222 on its upper and lower sides, respectively (the short-axis direction B). In an embodiment, the electrodes 222 can be grounded, and the electrodes 221 can be applied with a voltage. This is parallelly electrical connection for the stacked piezoelectric units 21. Accordingly, the stacked piezoelectric units 21 stretch in the thickness (the long-axis direction A), and displace in the long-axis direction A, which drives the elastic metal member 1 to displace in the short-axis direction B.

In an embodiment, the stacked piezoelectric units 21 are made of a single crystal material such as quartz, a thin film material such as zinc oxide, a polymer material such as polyvinylidene difluoride (PVDF), a ceramic material such as $Pb(ZrTi)O3$ (PZT), or a composite piezoelectric material such as a combination of PZT and silicon, glass or rubber.

A plurality of coupling members 3 can be disposed within the ring structure of the elastic metal member 1. As shown in FIG. 1A, two coupling members 3 can be disposed in the long-axis direction A and couple to two ends of the multilayer piezoelectric member 2 to the connection segments 12b and 12d of the elastic metal member 1, respectively. The thickness of the coupling members 3 can be determined by the size of the preload stress. In an embodiment, when a pre-external pulling force is imparted to the elastic metal member 1, the coupling members 3 having a greater thickness (the long-axis direction A) can be used to couple the multilayer piezoelectric member 2 and the elastic metal member 1, thereby by maintaining the pre-external pulling force. When a pre-internal pressure is imparted to the elastic metal member 1, the coupling members 3 having a less thickness (the long-axis direction A) can be used to couple the multilayer piezoelectric member 2 to the elastic metal member 1.

In an embodiment, the multilayer piezoelectric member 2, the coupling members 3 and the elastic metal member 1 can be coupled to one another by fixing members 6. As shown in FIG. 1A, the fixing members 6 are locking and attaching components, such as iron nails, rivets, screws and bolts, adhesive adhering the multilayer piezoelectric member 2 and the coupling members 3 to the connection segments 12b and 12d of the elastic metal member 1, or a locking and engaging device on the coupling members 3, the multilayer piezoelectric member 2 and the connection segments 12b and 12d of the elastic metal member 1, to strengthen the maintaining of the preload stress and prevent the preload stress from disappearing due to the vibration of the actuator for a period of time and the decoupling among the multilayer piezoelectric member 2, the coupling members 3 and the elastic metal member 1.

According to this disclosure, the elastic metal member converts the deformation of the multilayer piezoelectric member in its stacking direction (i.e., the long-axis direction of the elastic metal member) into vibration of the elastic metal member in the short-axis direction, and has a greater stroke. The connection segments are disposed among and integrally formed with a plurality of curved segments to constitute a quasi-oval elastic metal member, which, compared with the oval elastic metal member, has better performance in stroke and frequency. A preload stress can be imparted to the elastic metal member, the thickness of the coupling members can be adjusted to maintain the pre-external pulling force or the pre-internal pressure, and the elastic metal member having the preload stress allows the actuator to have a relatively high amplitude within a relatively low frequency range.

Figure 2:
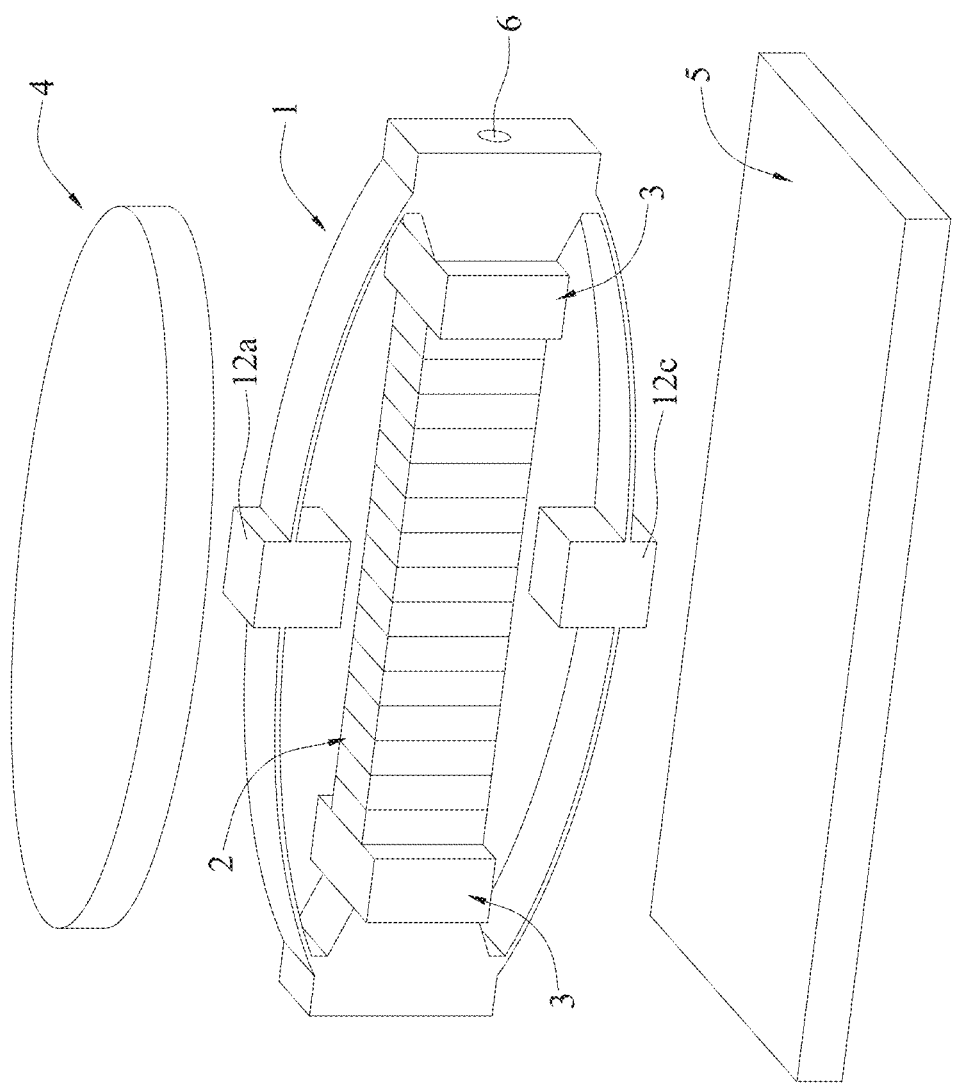
FIG. 2 is a schematic diagram of an acoustic transmitter of an embodiment according to this disclosure.

Refer to FIG. 2. An acoustic transmitter according to this disclosure comprises an elastic metal member 1, a multilayer piezoelectric member 2, a coupling members 3, a diaphragm 4, a carrier 5, and fixing members 6. The elastic metal member 1, the multilayer piezoelectric member 2, the coupling members 3 and the fixing members 6 have been described in the above paragraphs and FIG. 1A, further description hereby omitted.

As shown in FIG. 2, the diaphragm 4 can be disposed on the actuator and attached to the connection segments 12a of the elastic metal member 1 in the short-axis direction B, and be driven by the elastic metal member 1 and vibrate. The carrier 5 can be disposed on the actuator and attached to the connection segments 12c of the elastic metal member 1 in the short-axis direction B to support the actuator and the diaphragm 4. In an embodiment, the carrier 5 is a plate, as shown in FIG. 2. In another embodiment, the carrier 5 is a base or a frame. In an embodiment, the emission frequency of the acoustic transmitter is 10 Hz-500 Hz, and the stroke of the acoustic transmitter can be greater than 0.5 mm.

Since the frequency of the acoustic transmitter according to this disclosure is low, the acoustic wave can be transmitted farther, and can act as an acoustic source that detects any leak of a pipeline actively and gets to know whether the pipeline is degraded to an extent that a standing wave cannot be formed therein.

Figure 3:
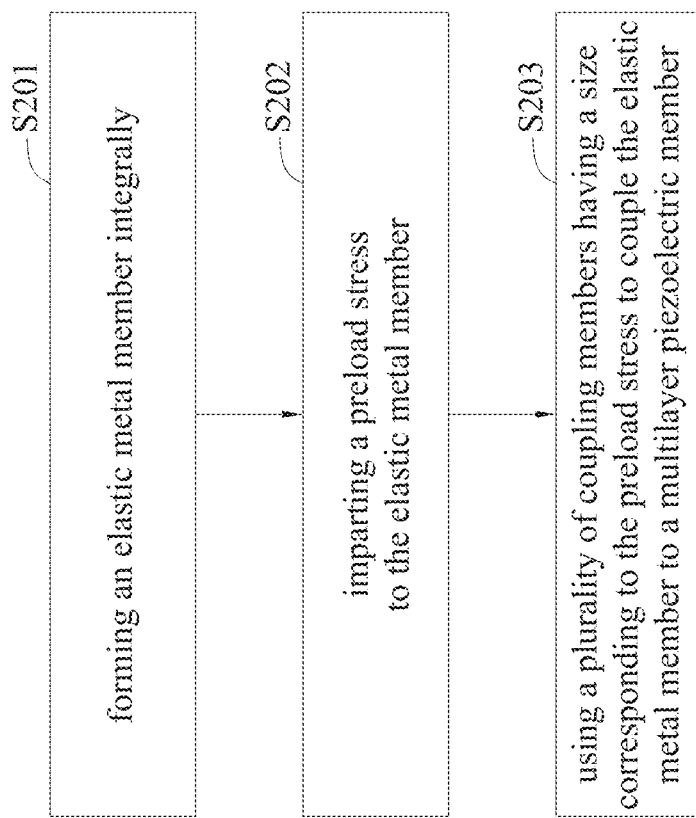
FIG. 3 is a method for manufacturing an actuator of an embodiment according to this disclosure.

Refer to FIG. 3, which is a flow chart of a method for manufacturing an actuator according to this disclosure.

In step S201, an elastic metal member is formed integrally. The formed elastic metal member has a plurality of curved segments and a plurality of connection segments to constitute a ring structure having a long-axis direction and a short-axis direction. Each of the curved segments can be a portion of an oval, and each of the connection segments can be a line segment. In an embodiment, the plurality of connection segments comprise two connection segments in the long-axis direction, and the plurality of curved segments comprise two curved segments symmetrical with respect to the long-axis direction. In another embodiment, the plurality of connection segments comprise two connection segments in the long-axis direction and another two connection segments in the short-axis direction, and the plurality of curved segments comprise four curved segments, two of which are symmetrical with respect to the long-axis direction and the others of which are also symmetrical with respect to the long-axis direction.

In step S202, a preload stress is imparted to the elastic metal member. An external pulling force or an internal pressure can be provided to the elastic metal member in the long-axis direction, to allow the elastic metal member to have the preload stress.

In step S203, a plurality of coupling members corresponding to the size of the preload stress are used to couple the elastic metal member to the multilayer piezoelectric member. The multilayer piezoelectric member can be formed by stacking a plurality of stacked piezoelectric units to form a multilayer piezoelectric member and form electrodes on the multilayer piezoelectric member. The multilayer piezoelectric member and the elastic metal member can be coupled by using coupling members, which couple two ends of multilayer piezoelectric member in its stacking direction to the connection segments of the elastic metal member in the long-axis direction, to maintain the preload stress. The size of the coupling members can be determined by the size of the preload stress. When a pre-external pulling force is imparted to the elastic metal member, coupling members having a greater thickness can be used to couple the multilayer piezoelectric member to the elastic metal member, to maintain the pre-external pulling force. When a pre-internal pressure is imparted to the elastic metal member, coupling members having a less thickness can be used to couple the multilayer piezoelectric member to the elastic metal member. In an embodiment, a plurality of fixing members can be used to connect the multilayer piezoelectric member, a plurality of coupling members and the elastic metal member in the long-axis direction, to strengthen the maintaining of the preload stress.

Refer to FIGS. 4-7 and table 1, which provide comparative examples and experimental examples to describe the vibration performance of the actuator according to this disclosure.

TABLE 1

| | long axis | short axis | connection segments | preload stress |
| --- | --- | --- | --- | --- |
| comparative example | 2a | 2b | none | none |
| experimental example 1 | 2a | 2b | c | none |
| experimental example 2 | 2a | 2b | c | external pulling 0.014 mm |
| experimental example 3 | 2a | 2b | c | external pulling 0.035 mm |
| experimental example 4 | 2a | 2b | c | external pulling 0.35 mm |
| experimental example 5 | 2a | 2b | c | internal pressure 0.014 mm |
| experimental example 6 | 2a | 2b | c | internal pressure 0.035 mm |
| experimental example 7 | 2a | 2b | c | internal pressure 0.35 mm |

Figure 4:
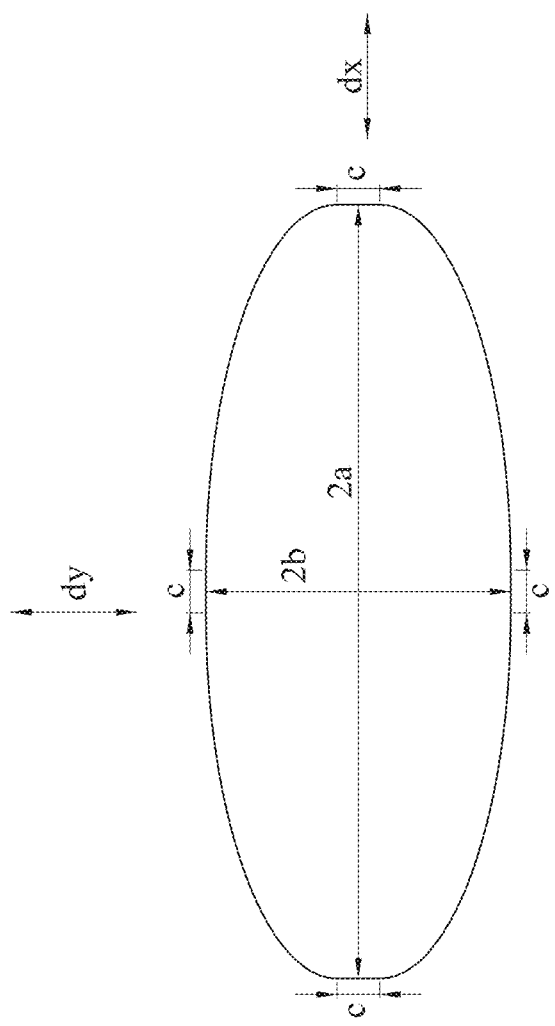
FIG. 4 is a planer schematic diagram of an elastic metal member of an experimental example 1 of an actuator of according to this disclosure.

In the experimental example 1 shown in FIG. 4, the elastic metal member of the actuator comprises a long axis of 2a long, a short axis of 2b long, four connection segments with a length of c, two of which are in the long axis and the others of which are in the short axis, and four curved segments among the connection segments. Each of the connection segments is a line segment, and each of the curved segments belongs to the same oval. The elastic metal member in the experimental example 1 is called an elastic metal member having a quasi-oval ring structure in the context. The experimental example 1 has no preload stress, a displacement dx is in the long-axis direction, and a displacement dy is in the short-axis direction. The comparative example employed by this disclosure includes an oval elastic metal member having a long axis of 2a long and a short axis of 2b long, and does not have connection segments or preload stress. In addition to having the same structure as the elastic metal member of the experimental example 1, the elastic metal members of the experimental examples 2-7 further include a variety of preload stresses, which include an external pulling 0.014 mm, an external pulling 0.035 mm, an external pulling 0.35 mm, an internal pressure 0.014 mm, an internal pressure 0.035 mm and an internal pressure 0.35 mm, which are imparted to the elastic metal members in the long-axis direction.

Figure 5:
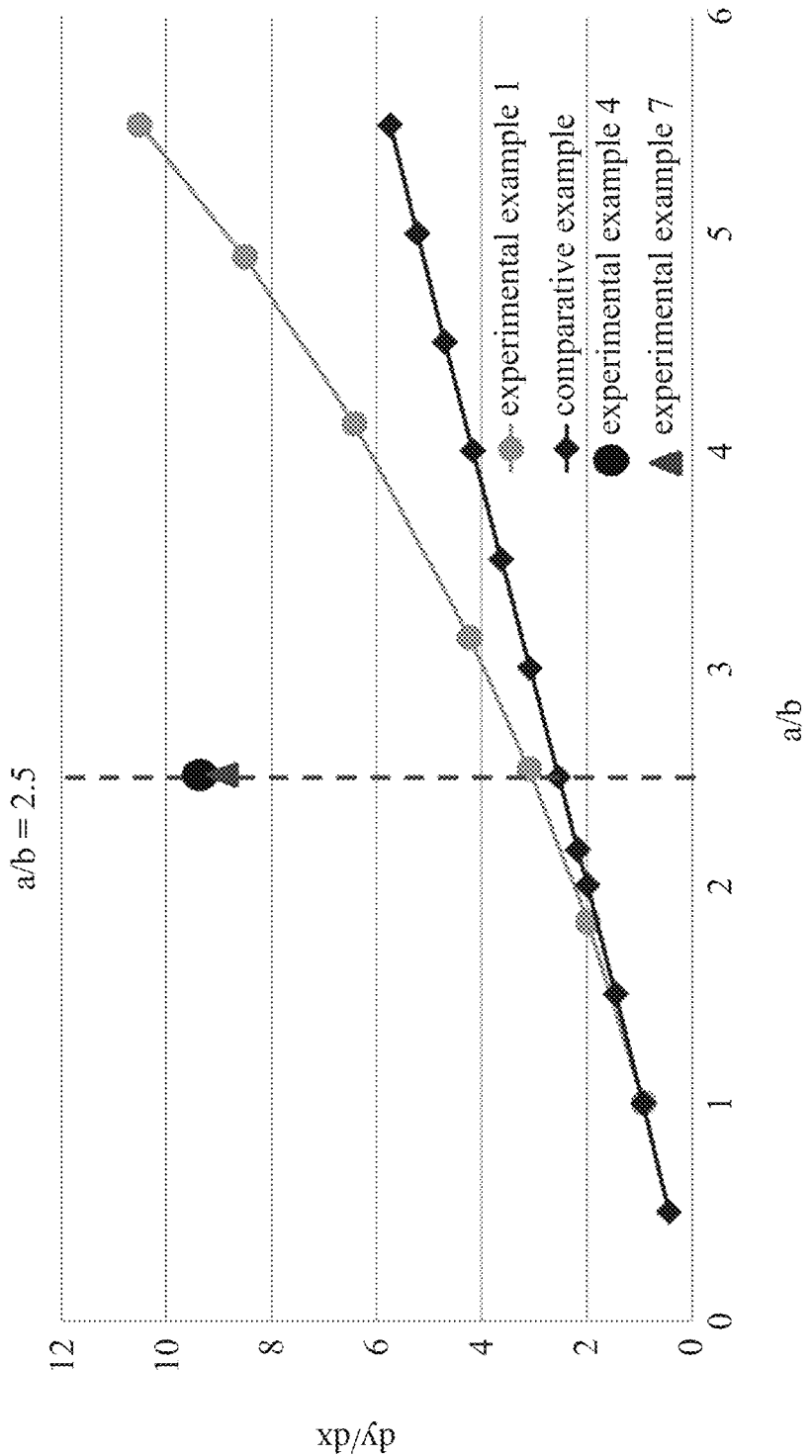
FIG. 5 shows a ratio of a long axis to a short axis and a stroke in a comparative example and experimental examples of an actuator according to this disclosure.

In FIG. 5, the horizontal axis represents a ratio of a long axis to a short axis (a/b), and the vertical axis dy/dx represents a stroke of the actuator, i.e., a ratio of a displacement of the elastic metal member in the short-axis direction to a displacement of the elastic metal member in the long-axis direction. It is known from FIG. 5 that the experimental example 1 has a greater stroke than the comparative example. If the ratio a/b is 2.5, the experimental examples 4 and 7 have a greater stroke than the comparative example. The greater the ratio a/b is, the greater the stroke becomes, e.g., 1.5-10, 1.5-8 or 2-6. It is thus known that an actuator employing an elastic metal member having a quasi-oval ring structure has a greater stroke than an actuator employing an elastic metal member having an oval ring structure. If further imparted with a preload stress of an external pulling or an internal pressure, the elastic metal member will have an even greater stroke.

Figure 6:
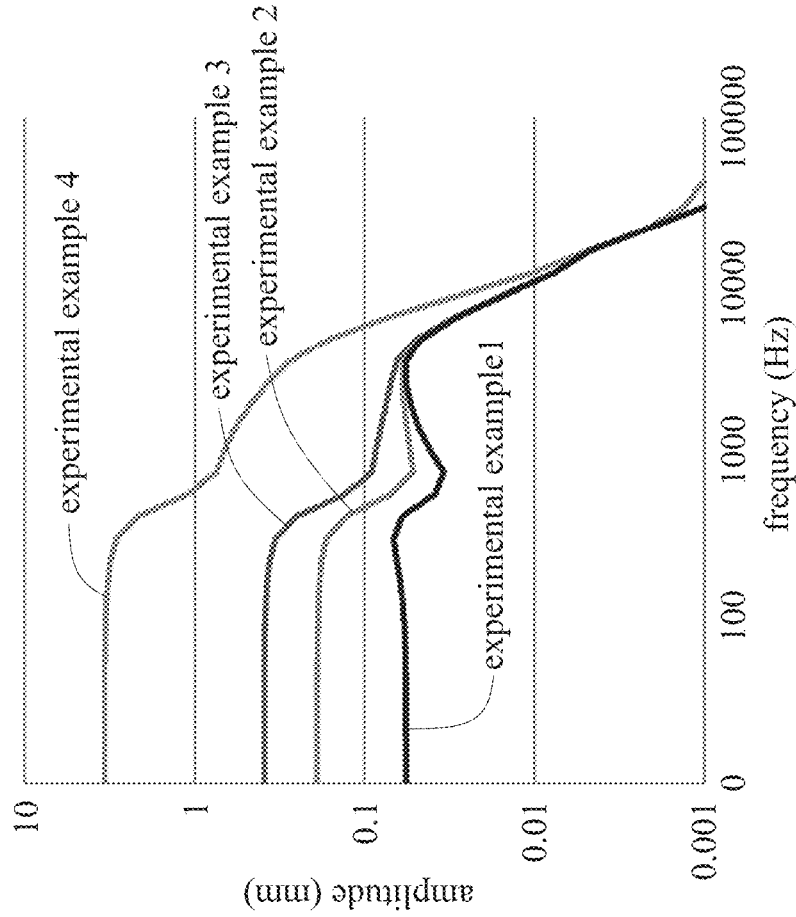
FIG. 6 shows the amplitude and frequency of experimental examples having a preload stress that is an external pulling and an experimental example having no preload stress.
Figure 7:
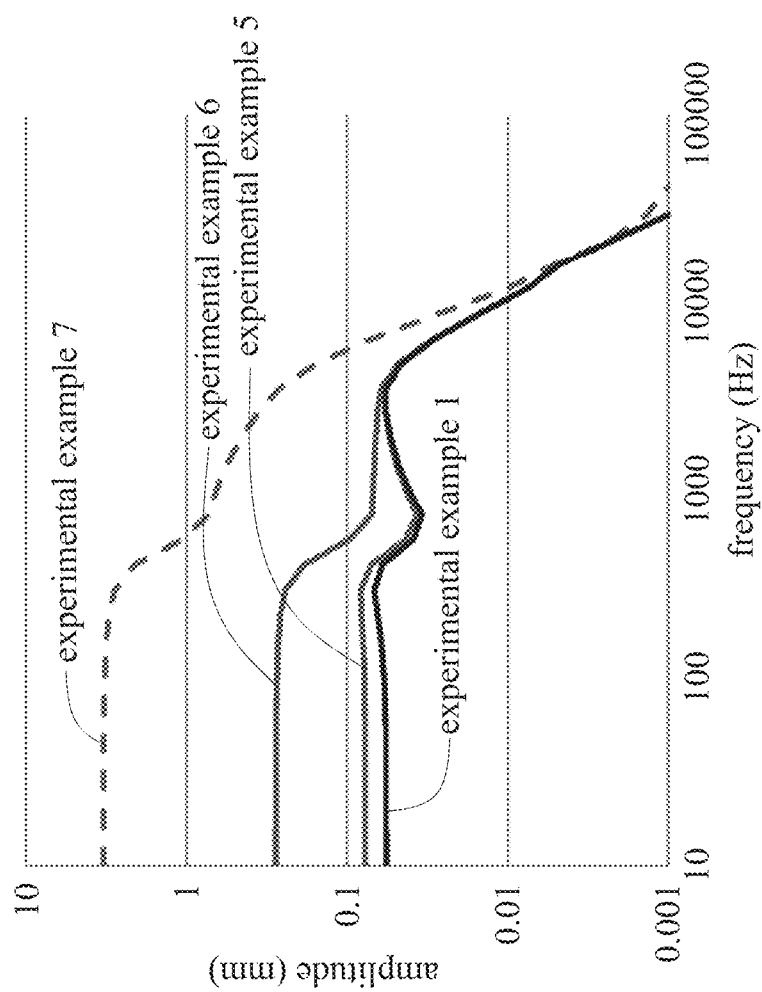
FIG. 7 shows the amplitude and frequency of experimental examples having a preload stress that is an internal pressure and an experimental example having no preload stress.

Refer to FIGS. 6 and 7. FIG. 6 shows the amplitude and frequency of the experimental examples 2-4 having a preload stress that is an external pulling and the experimental example 1 having no preload stress. FIG. 7 shows the amplitude and frequency of the experimental examples 5-7 having a preload stress that is an internal pressure and the experimental example 1 having no preload stress. It is known from FIGS. 6 and 7 that in a relatively low frequency, e.g., below 1000 Hz or even below 500 Hz, the elastic metal member of the experimental examples 2-7 that has the preload stress has a greater amplitude than the elastic metal member of the experimental example 1 that has no preload stress.

In sum, an actuator according to this disclosure comprises an elastic metal member having a quasi-oval ring structure, a multilayer piezoelectric member disposed in the elastic metal member and having a plurality of stacked piezoelectric units in a long-axis direction, and a plurality of coupling members disposed at two ends of the multilayer piezoelectric member to couple the multilayer piezoelectric member to elastic metal member in the long-axis direction. An acoustic transmitter according to this disclosure comprises the above-mentioned actuator and a diaphragm driven by the actuator. A plurality of coupling members corresponding to the size of a preload stress are disposed between two ends of the multilayer piezoelectric member in a stacking direction and the elastic metal member, to keeping imparting the preload stress to the elastic metal member. Therefore, the actuator according to this disclosure can still have a relatively high amplitude even in a relatively low frequency range. Since having a lower frequency, the acoustic transmitter according to this disclosure can transmit an acoustic wave farther.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An actuator, comprising:
an elastic metal member having a plurality of curved segments and a plurality of connection segments, the plurality of curved segments and the plurality of connection segments constituting a ring structure with a long-axis direction and a short-axis direction;
a multilayer piezoelectric member disposed within the ring structure of the elastic metal member and having a plurality of stacked piezoelectric units along the long-axis direction; and
a plurality of coupling members disposed within the ring structure of the elastic metal member,
wherein the multilayer piezoelectric member has two ends in the long-axis direction, and the two ends are coupled to the connection segments of the elastic metal member in the long-axis direction.

2. The actuator of claim 1, further comprising electrodes disposed on the multilayer piezoelectric member and configured for receiving a voltage deforming the multilayer piezoelectric member to drive the elastic metal member to vibrate in the short-axis direction.

3. The actuator of claim 1, wherein the elastic metal member has a preload stress, and the plurality of coupling members are disposed between the elastic metal member and the multilayer piezoelectric member to maintain the preload stress.

4. The actuator of claim 1, further comprising a plurality of fixing members connected in the long-axis direction to the elastic metal member, the multilayer piezoelectric member, and the plurality of coupling members.

5. The actuator of claim 1, wherein each of the curved segments is a portion of an oval, and each of the connection segments is a line segment.

6. The actuator of claim 1, wherein the plurality of connection segments include two connection segments in the long-axis direction, and the plurality of curved segments include two curved segments symmetrical with respect to the long-axis direction.

7. The actuator of claim 1, wherein the plurality of connection segments include two connection segments in the long-axis direction and another two connection segments in the short-axis direction, and the plurality of curved segments include four curved segments, with two of the four curved segments being symmetrical and the others being symmetrical with respect to the long-axis direction.

8. The actuator of claim 1, wherein the ring structure has a long axis in the long-axis direction and a short axis in the short-axis direction, and a ratio of the long axis to the short axis is between 1.5 and 10.

9. The actuator of claim 8, wherein the ring structure has a long axis in the long-axis direction and a short axis in the short-axis direction, and a ratio of the long axis to the short axis is between 1.5 and 8.

10. The actuator of claim 9, wherein the ring structure has a long axis in the long-axis direction and a short axis in the short-axis direction, and a ratio of the long axis to the short axis is between 2 and 6.

11. The actuator of claim 10, wherein the ring structure has a long axis in the long-axis direction and a short axis in the short-axis direction, and a ratio of the long axis to the short axis is about 2.5.

12. The actuator of claim 1, wherein the stacked piezoelectric units are made of a single crystal material, a polymer material, a ceramic material, or a composite piezoelectric material.

13. A method for manufacturing the actuator of claim 1, the method comprising:
providing the multilayer piezoelectric member having the plurality of stacked piezoelectric units;
forming integrally the elastic metal member having the plurality of curved segments and the plurality of connection segments, the plurality of curved segments and the plurality of connection segments constituting the ring structure with the long-axis direction and the short-axis direction;
imparting a preload stress to the elastic metal member; and
coupling, using the plurality of coupling members having a size corresponding to the preload stress, the two ends of the multilayer piezoelectric member in its stack direction to the connection segments of the elastic metal member in the long-axis direction.

14. The method of claim 13, wherein the multilayer piezoelectric member is formed by stacking the plurality of stacked piezoelectric units to form the multilayer piezoelectric member and forming electrodes on the multilayer piezoelectric member.

15. The method of claim 13, further comprising using a plurality of fixing members to connect the multilayer piezoelectric member, the plurality of coupling members and the elastic metal member in the long-axis direction.

16. An acoustic transmitter, comprising:
the actuator of claim 1 configured for receiving a voltage and vibrating;
a diaphragm disposed on the actuator and attached to one of the connection segments of the elastic metal member in the short-axis direction, the diaphragm being driven by the elastic metal member to vibrate; and
a carrier disposed on the actuator and attached to another one of the connection segments of the elastic metal member in the short-axis direction to support the actuator and the diaphragm.

17. The acoustic transmitter of claim 16, having an emission frequency of 10 Hz to 500 Hz and a stroke greater than 0.5 mm.

* * * * *